United States Patent
Cartwright (10) Patent No.: US 12,447,569 B2
(45) Date of Patent: Oct. 21, 2025

(54) SYSTEMS AND METHODS FOR AUTOMATED EXTRACTION OF HARDWARE FROM PRINTED CIRCUIT BOARDS

(71) Applicant: Semsotai USA Inc., Brea, CA (US)

(72) Inventor: Benjamin Caleb Cartwright, San Gabriel, CA (US)

( * ) Notice: Subject to any disclaimer, the term of this patent is extended or adjusted under 35 U.S.C. 154(b) by 0 days.

(21) Appl. No.: 18/964,349

(22) Filed: Nov. 30, 2024

(65) Prior Publication Data
US 2025/0178142 A1 Jun. 5, 2025

Related U.S. Application Data (60) Provisional application No. 63/604,483, filed on Nov. 30, 2023.

(51) Int. Cl.
*B23P 19/06* (2006.01)

(52) U.S. Cl.
CPC .................................. *B23P 19/06* (2013.01)

(58) Field of Classification Search
CPC ........ H05K 13/0486; B09B 3/30; B09B 3/35; B09B 2101/17; Y10T 29/53274; H01L 24/799; H01L 24/98; B23P 19/06
See application file for complete search history.

(56) References Cited

U.S. PATENT DOCUMENTS

2021/0040581 A1  2/2021  Song et al.
2022/0322592 A1* 10/2022  Rinne ...................... B09B 3/35

OTHER PUBLICATIONS

International Search Report and Written Opinion for PCT/US2024/057998, dated Jan. 31, 2025, 16 pages.
Takahashi, Y. et al. Recycling of Circuit Boards by Robot Manipulator Using Stereo Vision and Deep Learning. WiPiEC Journal-Works in Progress in Embedded Computing Journal, 9(2). Sep. 8, 2023 [retrieved on Jan. 16, 2025] Retrieved from the Internet [https://wipiec.digitalheritage.me/index.php/wipiecjournal/article/download/38/33] entire document.

* cited by examiner

*Primary Examiner* — Lee A Holly
(74) *Attorney, Agent, or Firm* — Marcus N. DiBuduo; John R. Aaron (57) ABSTRACT

Systems and methods for extracting hardware from printed circuit boards. An extraction system may include a robotic arm, a camera, and a conveyance system. An extraction system may also include a mechanism for retaining a printed circuit board in a particular position. One or more computers in operative connection with one or more control modules may be used to automate, or semi-automate, extraction of the hardware. An extraction method may include steps of conveying a printed circuit board toward a robotic arm, identifying hardware on the printed circuit board, engaging the robotic arm with the hardware, cutting around the hardware and removing it from the residual printed circuit board, disposing of the residual printed circuit board, and recycling the hardware.

21 Claims, 6 Drawing Sheets

SYSTEMS AND METHODS FOR AUTOMATED EXTRACTION OF HARDWARE FROM PRINTED CIRCUIT BOARDS

CROSS-REFERENCE TO RELATED APPLICATIONS

The present application claims priority to, and the benefit of, U.S. Provisional Patent Application No. 63/604,483, filed Nov. 30, 2023, which is hereby incorporated by reference in its entirety.

FIELD OF THE INVENTION

The present invention concerns systems and methods for extracting hardware from a printed circuit board. More particularly, embodiments of the present invention concern systems and methods for automatically or semiautomatically extracting hardware from printed circuit boards using a robotic arm.

BACKGROUND OF THE INVENTION

Conventional methods for extracting hardware from a printed circuit board include applying heat in the form of heated air, a heated iron, or a heated fluid to a portion of the printed circuit board to melt the solder bonding the hardware to the printed circuit board. Conventionally, printed circuit boards containing valuable hardware are collected and transported to a facility (in many cases, overseas), where humans manually remove the hardware of interest. After all of the subject hardware is removed, the remainder of the printed circuit board is destroyed, recycled, or disposed of, or is sent to other processing facilities for further processing of other hardware. The logistics and cost of transporting the entire decommissioned printed circuit board to various processing facilities is economically and environmentally inefficient, especially when the total amount of surface area of the printed circuit board is substantial relative to that portion of the printed circuit board containing the valuable hardware to be reused.

There, therefore, exists the need for systems and methods for efficiently and economically extracting useful and valuable hardware from printed circuit boards. More particularly, there exists the need for systems and methods which allow for automatic or semi-automatic dismantling of decommissioned printed circuit boards which provides the ability to recover valuable hardware and make it readily available for shipping and processing by third parties, while also preparing the remaining portion of the circuit board for environmentally safe disposal.

BRIEF SUMMARY OF THE INVENTION

The present invention provides the ability to reuse or repurpose valuable hardware from decommissioned printed circuit boards. The present invention offers significant advantages over conventional systems and methods by increasing the efficiency of extraction and optimizing the extracted product for further processing for repurposing efforts. The present invention overcomes the inefficiencies of the conventional methods. In some embodiments, the printed circuit board is cut into multiple portions: those containing the hardware to be removed and those which may be destroyed, recycled, or disposed of. By partitioning the printed circuit boards into (i) one or more portions having one or more valuable hardware pieces and (ii) residual portions of the printed circuit boards to be destroyed, recycled, or disposed of, economic and environmental efficiencies can be realized. For example, and without limitation, a printed circuit board may comprise two valuable microchips to be reused. In some embodiments of the present invention, the printed circuit board can be partitioned into a first piece having a first microchip, a second piece having a second microchip, and a residual portion. The first portion may be shipped to a first processing facility, the second portion may be shipped to a second processing facility, and the third portion may be shipped to a third processing facility. By shipping only the first portion to the first processing facility, unnecessary shipping weight is eliminated. Moreover, processing of the first portion by the first processing facility can be performed in parallel with processing of the second portion by the second processing facility, which improves the total time necessary to process the decommissioned printed circuit boards.

According to some embodiments of the present invention, a system for extracting hardware (in preferred embodiments, a microchip) from one or more printed circuit boards (hereafter, generally, "circuit board(s)") may comprise: a robotic arm, a camera, and a conveyance system for conveying the one or more circuit boards and hardware extracted therefrom. According to some embodiments, a robotic arm may be stationary or non-stationary. In some embodiments, the robotic arm (or, in some embodiments, a multi-arm robot) may comprise a hardware engagement mechanism and a cutting tool at a free (movable) end of the robotic arm. According to some embodiments, the hardware engagement mechanism may be configured to engage a portion of the one or more circuit boards, and/or any hardware thereon, and the cutting tool may be configured to cut through the one or more circuit boards. In some embodiments of the present invention, the cutting tool may be in the form of a rotary bit. In preferred embodiments, the cutting tool may be a bit controlled by a computer numerical control (CNC) system. According to some embodiments, the hardware engagement mechanism may be a vacuum suction cup. In some embodiments, the cutting tool may be configured to move vertically and horizontally. According to some embodiments, the cutting tool may be configured to move in a rotary motion around the hardware engagement mechanism.

In some embodiments, the camera may be configured to detect and identify the one or more circuit boards and associated hardware. According to some embodiments, the camera may be configured to detect a position and orientation of the one more circuit boards and associated hardware. In some embodiments, the camera may be operatively connected to the robotic arm and may be configured to transmit image data to the robotic arm. The camera may, according to some embodiments, be configured to identify characteristics of the hardware, such as the type of hardware.

In accordance with some embodiments, a conveyance system may comprise a first conveyor belt which may be configured to convey the one or more circuit boards toward and away from the robotic arm. In some embodiments, the first conveyor belt may comprise a plurality of slots, each slot for supporting a circuit board in an upright position. According to some embodiments, a conveyance means may also comprise a second conveyor belt which may be configured to convey hardware extracted from the one or more circuit boards. In some embodiments, the first conveyor belt may have a loading end for receiving a decommissioned circuit board with hardware engaged thereto and a discard end for discarding the circuit board with the hardware removed therefrom. The second conveyor belt may, according to some embodiments, have a recycling end whereby the hardware (and remaining portion of circuit board to which the hardware is attached) may be transported to another location for further processing.

In accordance with some embodiments of the present invention, the robotic arm, the camera, and one or more conveyor belts may be operatively connected to a system controller which may comprise a processor having a memory. In some embodiments, the system controller may cause the one or more conveyor belts to move in response to data received from the camera. According to some embodiments, the system controller may cause the one or more conveyor belts to move in response to data received from the robotic arm. In some embodiments, instructions from the system controller may cause the robotic arm to move in response to data received from the camera. In some embodiments, an arm motion control module may be operatively connected to the robotic arm and the system controller, such that the arm motion control module may actuate the robotic arm in response to data received by the system controller and transmitted to the arm motion control module. According to some embodiments, a conveyance control module may be operatively connected to a conveyance system (which may operate one or more motors of the one or more conveyor belts), such that the conveyance control module may actuate the conveyance system (and, therefore, the one or more motors of the conveyor belts) in response to data received by the system controller and transmitted to the conveyance control module.

According to some implementations of the present invention, a method for extracting hardware (in some embodiments, a microchip) from a circuit board may comprise, first, receiving a circuit board with connected hardware onto a first conveyor belt. Next, the circuit board may be conveyed generally toward a robotic arm configured to engage the hardware and a camera configured to detect the circuit board and hardware and capture images thereof. Once the circuit board is in a position for hardware extraction by the robotic arm, the circuit board may be detected and a location of the connected hardware may identified. Following, the camera may transmit image data to the robotic arm (via a system controller, in some implementations) corresponding to the characteristics of the circuit board and hardware, where the characteristics may include positional and/or spatial data. Next, in response to the data received from the camera, an end of the robotic arm may move toward the hardware of the circuit board and may engage the hardware using a hardware engagement mechanism at the end of the robotic arm. Once engaged with the hardware, the robotic arm may pierce the circuit board adjacent to the hardware using a cutting tool. Next, the robotic arm may move the cutting tool in a motion around the hardware until a complete cut is made. After the cut is made, the robotic arm may lift the hardware, and a piece of the circuit board to which the hardware is attached, from the residual circuit board and place the hardware (by disactivating the hardware engagement mechanism) onto a second conveyor belt (or, alternatively, if the circuit board was suspended, after the cut is made, the residual circuit board may naturally displace from the hardware and adjacent piece of circuit board).

In some implementations, after the cut piece of the circuit board (with the attached hardware) is removed from the residual circuit board, the first conveyor belt may convey the residual circuit board generally away from the robotic arm and to a location for disposal (e.g., shredding) or recycling. According to some implementations, after the hardware is removed from the circuit board, the second conveyor belt may convey the hardware generally away from the robotic arm and to a location for further processing. In some implementations, the hardware may be further processed by packaging the hardware for shipping to a third party. According to some implementations, the hardware may be further processed or modified in preparation for use with a new circuit board.

In some implementations, a system controller having a processor with a memory (or otherwise operatively connected to a computer), which may be operatively connected to one or more motors of the robotic arm and one or more motors of the conveyor belts (via one or more corresponding motor drivers), may cause the first conveyor belt to move the circuit board towards the robotic arm in response to data received by from the camera, where the data may indicate that the circuit board is not in a position for hardware extraction. According to some implementations, positional and/or spatial data may be received by the system controller from the camera and the system controller may cause the robotic arm to move in response to the data. In some implementations, once the hardware engagement mechanism (e.g., a vacuum suction cup) is engaged with the hardware, the system controller may cause the cutting tool to pierce the circuit board and move in a circular motion in response to data received from the robotic arm. In accordance with some implementations, after the cutting tool has made a complete cut, the system controller may cause the robotic arm to lift the hardware and a piece of the circuit board on which the hardware is attached from the residual circuit board and place the hardware onto the second conveyor belt in response to data received from the robotic arm. In some implementations, the system controller may cause the second conveyor belt to move in response to data received from the robotic arm.

According to some embodiments of the present invention, a system for extracting hardware from a printed circuit board may comprise: a) a robotic arm which may comprise at least one motor, a cutting tool, a hardware engagement mechanism, and an arm control module, where the arm control module may be engaged with the at least one motor, the cutting tool, and the hardware engagement mechanism; b) a camera which may comprise an image sensor and a processing portion; c) a conveyance system for conveying the printed circuit board which may have a conveyance control module engaged to at least one motor; d) a system controller which may be operatively connected to each of the arm control module, the conveyance control module, and the camera, where the system controller may comprise a processor having a memory; wherein the hardware engagement mechanism may be configured to engage and hold the hardware, wherein the camera may be configured to capture one or more images of the printed circuit board and the hardware, wherein the cutting tool may be configured to cut through the printed circuit board, and wherein the system controller may be configured to provide instructions to the arm control module and the conveyance control module in response to image data received from the camera. In some embodiments, the hardware engagement mechanism may comprise a suction cup. In some embodiments, the cutting tool may comprise a computer numerical control bit. In some embodiments, the conveyance system may comprise a conveyor belt which may have at least one slot for supporting a bottom of the printed circuit board. In some embodiments, the hardware may comprise a microchip. In some embodiments, the system may further comprise: c) a retaining system configured to move and retain a top side of the printed circuit board. In some embodiments, the retaining system may comprise a first arm and a second arm which may each be pivotally engaged with a crossbar, and wherein the retaining system may be configured to retain a portion of the top side of the printed circuit board between the first arm and the second arm. In some embodiments, the retaining system may be configured to move each of the first arm and the second arm in a vertical direction. In some embodiments, each of the first arm and the second arm may be configured to pivot about 90 degrees.

According to some embodiments of the present invention, a method for extracting one or more hardware pieces from a printed circuit board using (i) a robotic arm which may have a cutting tool at a free end, (ii) a camera, and (iii) a conveyance system for conveying the printed circuit board and the one or more hardware pieces may comprise the steps of: a) receiving the printed circuit board; b) conveying the printed circuit board toward the robotic arm; c) capturing at least one circuit board image using the camera; d) from the at least one image, identifying a first hardware piece and the printed circuit board; e) moving the free end of the robotic arm toward the printed circuit board; f) activating a hardware engagement mechanism of the robotic arm to engage the first hardware piece; g) piercing the printed circuit board with the cutting tool adjacent to the first hardware piece; h) moving the cutting tool around the first hardware piece until a first extracted portion of the printed circuit board with the first hardware piece may be removed from a first residual portion of the printed circuit board; and i) disactivating the hardware engagement mechanism to release the first extracted portion. In some embodiments, the method may further comprise the step of: j) conveying the first extracted portion toward a recycling end of the conveyance system. In some embodiments, the first residual portion may comprise a second hardware piece and the method may further comprise the steps of: j) activating the hardware engagement mechanism of the robotic arm to engage the second hardware piece; k) piercing the printed circuit board with the cutting tool adjacent to the second hardware piece; l) moving the cutting tool around the second hardware piece until a second extracted portion of the printed circuit board with the second hardware piece may be removed from a second residual portion of the printed circuit board; and m) disactivating the hardware engagement mechanism to release the second extracted portion. In some embodiments, the method may further comprise the step of: n) conveying each of the first extracted portion and the second extracted portion toward a recycling end of the conveyance system. In some embodiments, the first hardware piece may be a first microchip and the second hardware piece may be a second microchip. In some embodiments, the method further may comprise the step of: o) shipping the first extracted portion to a first processing facility and shipping the second extracted portion to a second processing facility. In some embodiments, the method may further comprise the step of: p) conveying the second residual portion toward a disposal end of the conveyance system. In some embodiments, the method may further comprise the step of: q) shipping the second residual portion to a third processing facility. In some embodiments, before the step of conveying the printed circuit board toward the robotic arm, the camera may capture a first image and transmit a first image data set to a system controller operatively connected to the camera, where the first image data set may comprise the first image. In some embodiments, the step of conveying the printed circuit board toward the robotic arm may comprise actuating the conveyance system using a conveyance control module operatively connected to each of the conveyance system and the system in response to the first image data. In some embodiments, after the step of capturing the circuit board image using the camera, a second image data set may be transmitted to the system controller, where the second image data set may comprise the circuit board image. In some embodiments, the system controller may be operatively connected to the robotic arm and each of the steps of: c) moving the free end of the robotic arm toward the printed circuit board; f) activating the hardware engagement mechanism of the robotic arm to engage the first hardware piece; g) piercing the printed circuit board with the cutting tool adjacent to the first hardware piece; and h) moving the cutting tool around the first hardware piece until the first extracted portion of the printed circuit board with the first hardware piece may be removed from the first residual portion of the printed circuit board; may be caused by the system controller in response to the second image data. In some embodiments, before the step of moving the robotic arm toward the printed circuit board, a location of the first hardware piece on the printed circuit board may be identified using the second image data.

In accordance with some embodiments of the present invention, a method for recycling a plurality of printed circuit boards may comprise the steps of: a) separating a first portion of each of the printed circuit boards from a second portion of each of the printed circuit boards, where the first portion may have a hardware piece, wherein the step of separating may comprise the steps of: 1) receiving each of the printed circuit boards on a first end of a first conveyor; and 2) for each printed circuit board, removing the printed circuit board from the first conveyor with a robotic arm, removing the first portion of the printed circuit board with a cutting tool of the robotic arm, placing the first portion of the printed circuit board on a second conveyor, placing the second portion of the printed circuit board on the first conveyor, moving the first conveyor to deposit the second portion of the printed circuit board in a first container, and moving the second conveyor to deposit the first portion of the printed circuit board in a second container; b) shipping the first container to a first location; and c) shipping the second container to a second location.

DETAILED DESCRIPTION OF THE INVENTION

The invention, in its various aspects, will be explained in greater detail below. While the invention will be described in conjunction with several exemplary embodiments, the exemplary embodiments themselves do not limit the scope of the invention. Similarly, the exemplary illustrations in the accompanying drawings, where like elements have like numerals, do not limit the scope of the exemplary embodiments and/or invention, including any length, angles, or other measurements provided. Rather the invention, as defined by the claims, may cover alternatives, modifications, and/or equivalents of the exemplary embodiments.

According to some embodiments of the present invention, a system for extracting hardware from a circuit board may comprise a robotic arm, a camera, and a conveyance system for conveying the circuit board and hardware extracted therefrom. For example, and with reference, generally, to FIGS. 1 and 2, an extraction system 10 may comprise a robotic arm 20, a camera 30, a first conveyor belt 41, a second conveyor belt 42, and a circuit board 50 with a microchip 52. In some embodiments, a robotic arm may comprise a mechanism for engaging a circuit board and a tool for cutting the circuit board. For example, and with further reference to FIG. 1, robotic arm 20 may comprise a vacuum suction cup 22 at a free end of robotic arm 20 which may be configured to engage and hold microchip 52. Robotic arm 20 may also comprise a cutting tool 24 (in preferred embodiments, a CNC bit) at the free end which may be configured to pierce and cut through circuit board 50, preferably adjacent to microchip 52. In preferred embodiments, a cutting tool may be configured to move muti-directionally. For example, cutting tool 24 may be configured to move in a vertical direction and a horizontal direction. In some embodiments, a cutting tool may be configured to move in a circular or rotational motion. For example, and with reference to FIG. 2, cutting tool 24 (illustrated in FIG. 1) may be configured to move radially around suction cup 22, forming a generally circular path P (with the direction of motion depicted by an arrow) around microchip 52 (when suction cup 22 is engaged with microchip 52).

Figure 1:
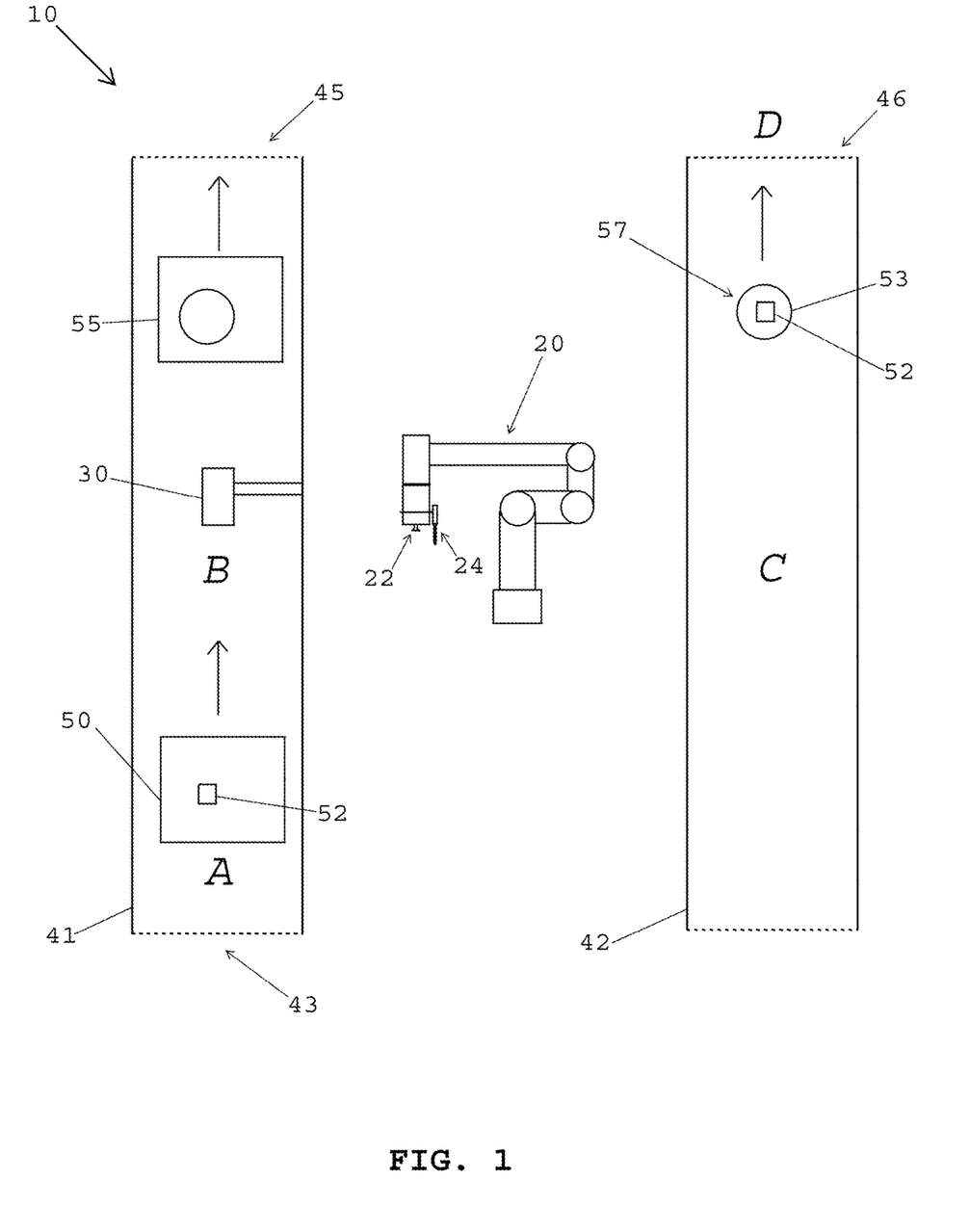
FIG. 1 is a diagram illustrating an exemplary system for extracting a microchip from a circuit board, in accordance with some embodiments of the present invention.
Figure 2:
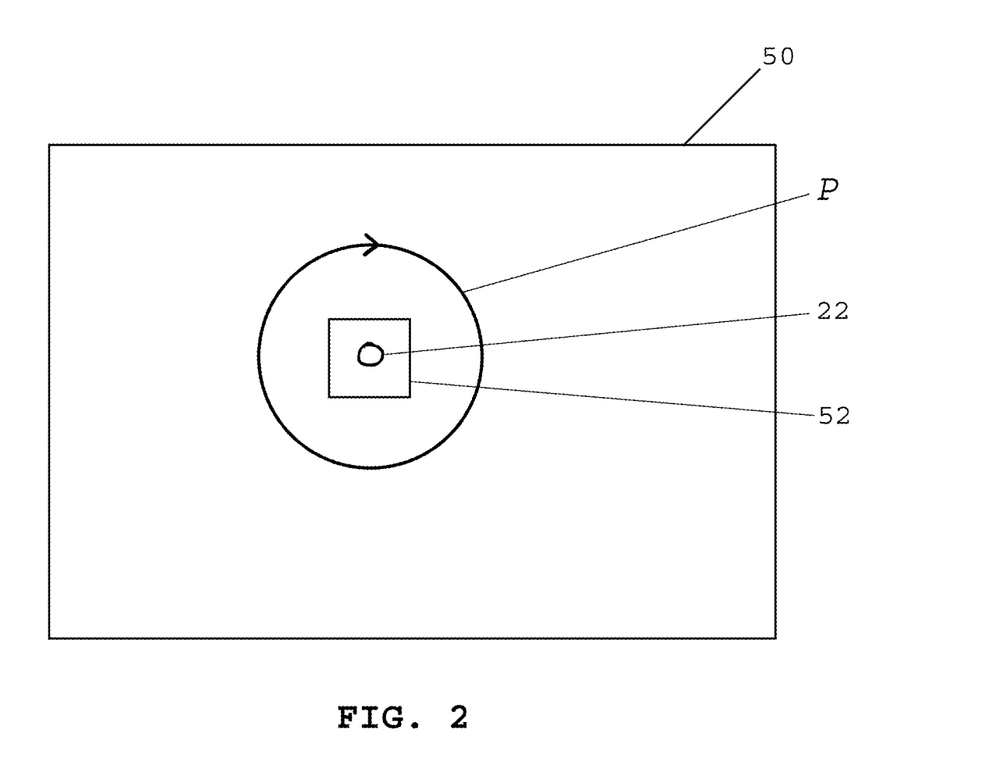
FIG. 2 is a top view diagram illustrating a simplified exemplary printed circuit board having a microchip, in accordance with some embodiments of the present invention.

According to some embodiments of the present invention, a camera operatively connected to a system controller may be configured to capture one or more images and identify therefrom a circuit board and any hardware component(s) thereon. For example, camera 30 may comprise an image sensor and a processing portion having a processor and software for capturing an image of circuit board 50, as well as microchip 52 (when within the field of view of camera 30) and transmitting image data to a system controller (or, generally, a computer). In some embodiments, using image data from a camera the system controller may be configured to identify a position and orientation of a circuit board and associated hardware component(s). For example, image data transmitted by camera 30 to a system controller (not illustrated) may be used to identify whether circuit board 50 is in a position for robotic arm to make contact with circuit board 50 and/or whether it's in an upright orientation. Similarly, image data transmitted by camera 30 to a system controller may be used to identify a position of microchip 52 on circuit board 50. In some aspects, a relative position of a circuit board and/or hardware may be determined by a system controller using image data from a camera. For example, image data transmitted by camera 30 to a system controller may be used to determine a position of circuit board 50 relative to robotic arm 20, as well as a position of microchip 52 relative to a position of circuit board 50.

According to some embodiments, a camera may be operatively connected to one or more motor drivers (or, generally, a control module) of the robotic arm and may be configured to transmit data directly or indirectly to the robotic arm (via a system controller, in some embodiments). In some embodiments, the camera may be engaged with the system controller that may also be engaged with the motor driver(s) of the robotic arm. In other embodiments, part of the processing portion of the camera and a portion of the motor driver(s) of the robotic arm may be within the system controller. In operation, for example, when circuit board 50 is within the field of view of the camera, it may transmit spatial and/or positional data to robotic arm 20 which may cause robotic arm 20 to move in response. In another example, and with reference, briefly, to FIGS. 3 and 4, a camera 130 may identify a position of a circuit board 150 with a microchip (not illustrated) near camera 130 and a robotic arm 120 and determine that circuit board 150 is generally oriented in a vertical direction. Camera 130 may transmit image data comprising the position and orientation of circuit board 150, as well as a position of the microchip on circuit board 150, to robotic arm 120 causing it to move toward and/or to make contact with circuit board 150.

According to some embodiments of the present invention, a conveyance system may be engaged with the system controller and may be configured to transport a circuit board generally toward and away from a robotic arm and camera. For example, and with further reference to FIG. 1, first conveyor belt 41 may be configured to transport circuit board 50 generally toward camera 30 and robotic arm 20 (with the direction of motion indicated by an arrow) to allow circuit board 50 to be within reach of robotic arm 20. First conveyor belt 41 may have a loading end 43 where circuit board 50 may be loaded onto, or received by, conveyor belt 41 for extraction by robotic arm 20. After extraction, a residual portion 55 of circuit board 50 (with an extracted portion 57 of circuit board 50 leaving a hole) may be transported by first conveyor belt 41 toward a discard end 45 for disposal, or for processing (e.g., shredding) prior thereto.

According to some embodiments, a conveyance system may be configured to receive extracted hardware from a circuit board. For example, and as further illustrated in FIG. 1, second conveyor belt 42 may be configured to receive extracted portion 57 from circuit board 50, comprising microchip 52 and extracted circuit board 53. Second conveyor belt 42 may also be configured to convey extracted portion 57 toward a recycling end 46 (with the direction of motion indicated by an arrow). In some embodiments, at a recycling end, an extracted portion (with one or more microchips, and/or other hardware) may be packaged (to be shipped, for example), or transported to another location for further processing (e.g., reused or repurposed for product manufacturing).

Figure 3:
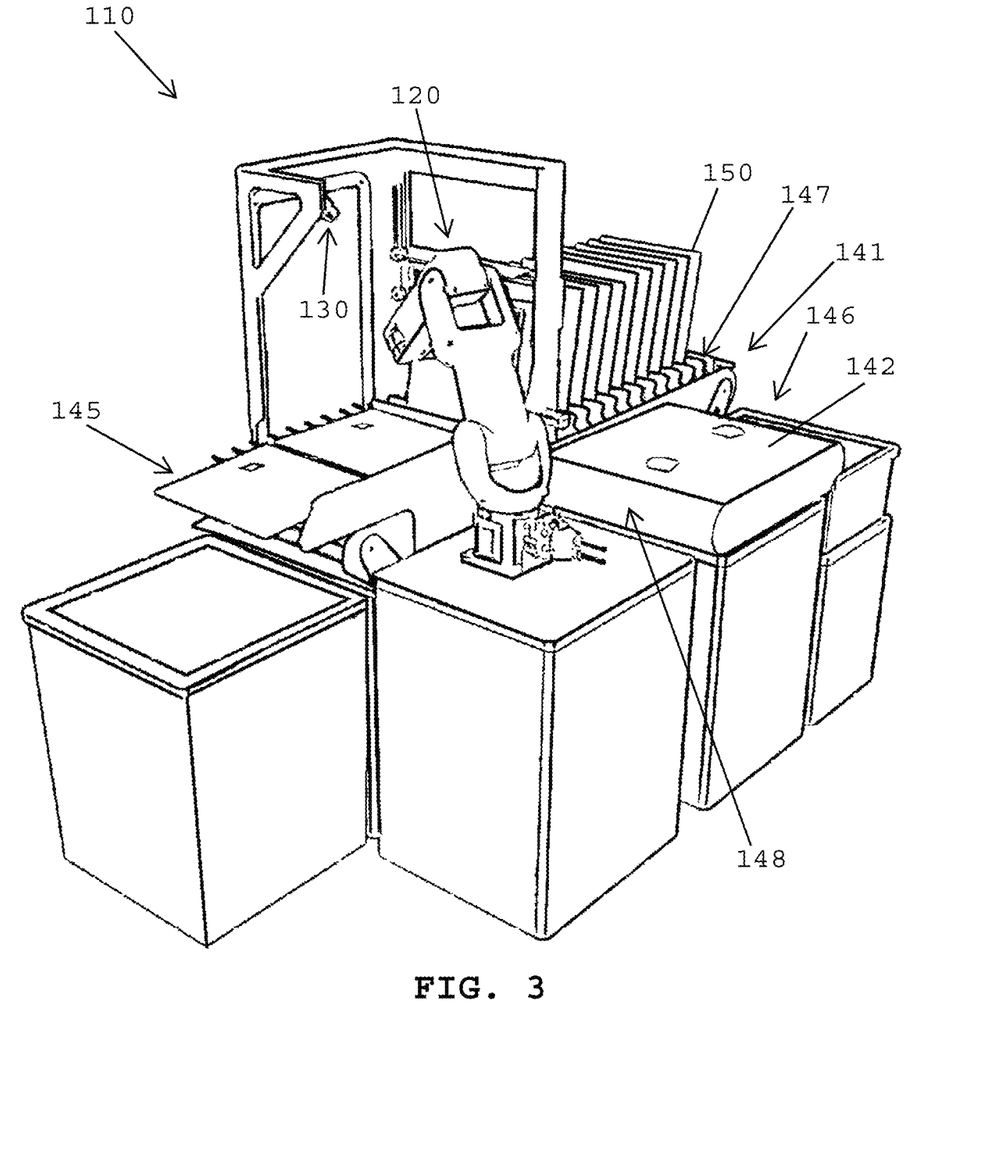
FIG. 3 is a diagram illustrating an exemplary system for extracting microchips from circuit boards, in accordance with some embodiments of the present invention.
Figure 4:
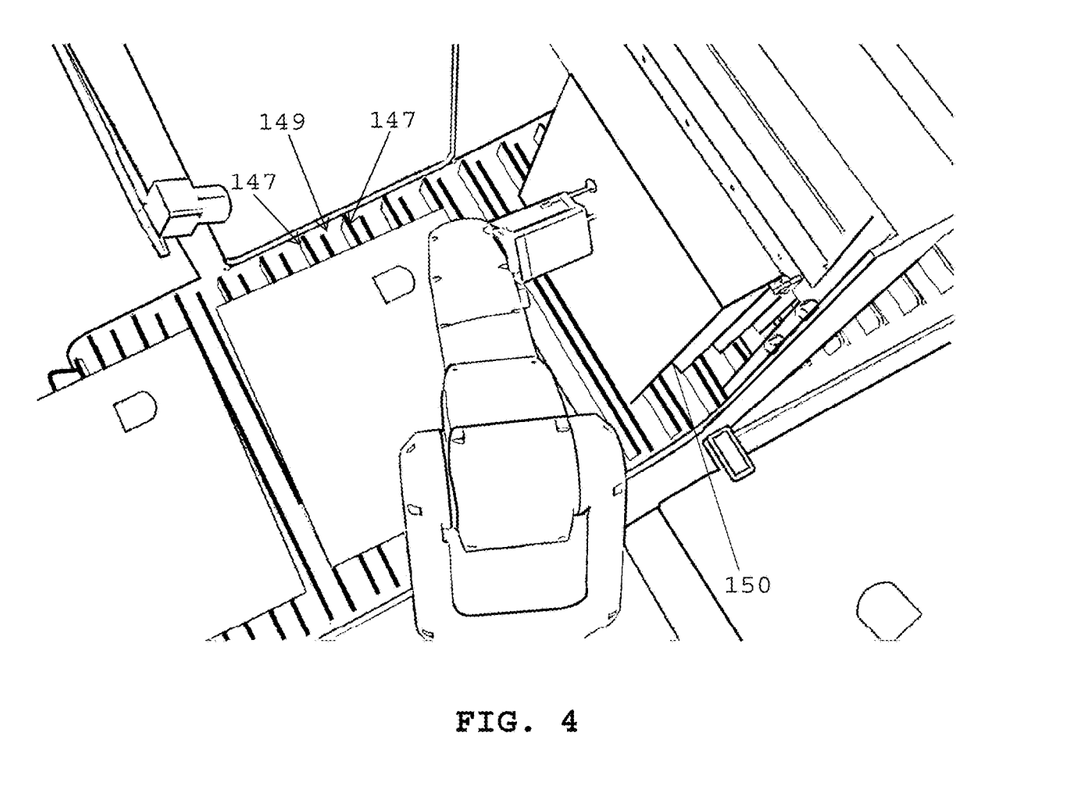
FIG. 4 is a diagram illustrating a portion of the system of FIG. 3, in accordance with some embodiments of the present invention.

According to some embodiments of the present invention, a conveyor belt may comprise a plurality of protrusions, walls, or the like, for supporting circuit boards during conveyance. For example, and with reference to FIGS. 3 and 4, a first conveyor belt 141 may comprise a plurality of walls 147, with adjacent walls forming slots 149 therebetween. Slots 149 may be preferably configured to support a circuit board 150 in an upright position (as illustrated in FIG. 3) as circuit board 150 is conveyed toward a robotic arm 120.

In some embodiments of the present invention, an extraction system may comprise a retaining system for orienting and retaining a circuit board in a position. For example, and with reference to FIG. 5, an extraction system 210 may comprise a retaining system 270 having a first arm 271 and a second arm (not illustrated) on the other side of first arm 271 disposed above a conveyor belt 240 (see also, e.g., arms 371 and 372 of extraction system 310 illustrated in FIG. 6). In some embodiments, a retaining system may be configured to grasp a circuit board (using a clamp-like motion, for example) and reorient the position thereof. For example, and with further reference to FIG. 5, each of first arm 271 and the second arm may be pivotally engaged to a crossbar (not illustrated) between a pair posts 281 and 282 along a first side of each arm such that a second side of each arm may pivot towards and away from the crossbar. In some embodiments, the arms of a retaining system may be configured to rotate about 90 degrees. The pivotal motion of first arm 271 and the second arm may allow retaining system 270 to grasp and secure a circuit board by closing the arms when a top edge of the circuit board is between the arms.

According to some embodiments, the arms of a retaining system may be configured to move vertically and/or horizontally which may allow the retaining system, for example, to move a circuit board from a horizontal position (e.g., lying flat on a conveyor belt) to a vertical position, and vice versa. For example, and with further reference to FIG. 5, retaining system 270 may be configured to move first arm 271 and the second arm in a vertical direction along and between posts 281 and 282. When a circuit board is in position for extraction, retaining system 270 may move from a position above the circuit board to a position in which a top edge of the circuit board is between first arm 271 and the second arm.

In some embodiments, the arms of a retaining system may be configured to pivot independently or simultaneously. For example, and with reference to extraction system 310 of FIG. 6, when a first arm 371 and second arm 372 of a retaining system 370 are in a closed position (i.e., with the free ends pivoted toward each other) with a portion of the top of a circuit board (not illustrated) disposed therebetween, first arm 371 and second arm 372 may simultaneously pivot in a direction to cause the top of the circuit board to move in the same direction, which may cause the top of the circuit board to fall toward the same direction (and move from a vertical position toward a horizontal position). As another example, while the top of the circuit board is secured between first arm 371 and second arm 372, one of the arms may first pivot in a direction away from the circuit board, then the other of the two arms may pivot in the same direction which may push the top of circuit board and eventually cause it to fall toward the same direction. Alternatively, first arm 371 and second arm 372 could pivot simultaneously in the same direction (so that the top of the circuit board is leaning in the same direction, but still retained within the arms), then one of the arms could continue pivoting while the other arm remains stationary which may also cause the top of the circuit board to fall in the same direction.

According to some embodiments of the present invention, a robotic arm, a camera, a conveyor belt, and a retaining system may each be operatively connected to one or more computers having a processor with a memory. For example, and with reference to FIG. 5, one or more motors of robotic arm 220, camera 230, and one or more motors of conveyor belt 240 may each be operatively connected to a system controller 262 which may be disposed within a control housing 260. In some embodiments, each motor of a robotic arm, conveyor system, and/or retaining system may have a motor driver or a control module (which may be adjacent to a corresponding motor or to a computer, such as the system controller) operatively connected to a computer to receive instructions therefrom and actuate a corresponding motor based on the instructions. For example, robotic arm 220 may comprise one or more motor drivers operatively connected to each of system controller 262 and one or more corresponding motors of robotic arm 220 to actuate the one or more motors. Similarly, conveyor belt 240 may comprise one or more motor drivers operatively connected to each of system controller 262 and one or more corresponding motors of conveyor belt 240 to actuate the one or more motors. Furthermore, retaining system 270 may comprise a one or more motor drivers operatively connected to each of system controller 262 and one or more corresponding motors of retaining system 270 to actuate the one or more motors (to control first arm 271 and the second arm thereof, as well as the vertical position of retaining system 270). In some embodiments, a motor may be manually operable directly via a motor driver controller or indirectly via a computer (e.g., a system controller).

In some embodiments, a computer may cause a conveyor belt and/or robotic arm to move in response to image data received by a system controller from a camera. For example, and with reference to FIG. 1, when circuit board 50 is on first conveyer belt 41 at a position where camera 30 does not sense circuit board 50 (i.e., not within the field of view or not within a defined area of the field of view) and/or robotic arm 20 cannot engage circuit board 50 (such as the position illustrated in FIG. 1), a system controller may cause first conveyor belt 41 to move circuit board 50 in the direction of camera 30. Similarly, once microchip 52 is extracted, a system controller may cause first conveyor belt 41 to move residual portion 55 away from camera 30.

According to some embodiments of the present invention, a system controller may be configured to actuate a conveyor system, a robotic arm, and a retaining system in response to image data from a camera. For example, and with reference to FIG. 5, when a circuit board is on conveyor belt 240, but not in an extractable position (as determined by camera 230), system controller 262 may activate conveyor belt 240 (by actuating the motor(s) thereof) to convey the circuit board toward robotic arm 220. When the circuit board is in an extractable position (as determined by camera 230), system controller 262 may deactivate conveyor belt 240 to stop conveyance of the circuit board. When the circuit board is in an extractable position, system controller 262 may cause retaining system 270 to secure the circuit board prior to extraction. When the circuit board is in an extractable position, system controller 262 may activate robotic arm 220 for extraction. When the circuit board is in an extractable position, system controller 262 may activate a hardware engagement mechanism 222, causing it to engage a microchip on the circuit board. When the microchip is engaged, system controller 262 may activate a cutting tool 224, causing it to cut through the circuit board and around the microchip. Once the microchip is extracted from the circuit board, system controller 262 may deactivate robotic arm 220. Once the microchip is extracted from the circuit board, system controller 262 may cause retaining system 270 to release the residual circuit board. Once the residual circuit board is released, system controller 262 may activate conveyor belt 240 to convey the residual circuit board away from robotic arm 220.

Referring back now to FIG. 1, the path of microchip 52 during an extraction process may be generalized by positions A, B, C, and D. Firstly, microchip 52 (as part of circuit board 50) may enter extraction system 10 at position A by being loaded onto first conveyor belt 41. Microchip 52 may then reach position B where it may cut out from circuit board 50 using robotic arm 20. Then, microchip 52 may be extracted and transported over to second conveyor belt 42 at position C. Lastly, extracted portion 57 with microchip 52 may exit from extraction system 10, indicated by position D.

In one exemplary implementation, and with further reference to FIG. 1, a first step in a method of extracting microchip 52 from circuit board 50 may comprise loading circuit board 50 onto first conveyor belt 41 at loading end 43. Next, circuit board 50 may be conveyed toward camera 30. When circuit board 50 is within the field of view of camera 30 and the system controller has sensed that microchip 52 is in an extractable position, motion of first conveyor belt 41 may be stopped (either manually or automatically in response to feedback from camera 30). Next, camera 30 may identify the location of microchip 52 on circuit board 50, a position of circuit board 50, and an orientation of circuit board 50. Following, image data corresponding to such information may be transmitted to robotic arm 20 (or to a computer operatively connected to camera 30 and robotic arm 20). Next, in response to the image data received from camera 30, the engaging end of robotic arm 20 (i.e., the end with suction cup 22) may move toward microchip 52, making contact therewith at suction cup 22. Suction cup 22 may then engage microchip 52 by creating a vacuum seal therebetween, allowing robotic arm 20 to move circuit board 50 or hold it in a fixed position. If necessary, robotic arm 20 may move circuit board 50 into a particular position before extraction begins. For example, if a circuit board is oriented horizontally, a robotic arm may reorient the circuit board so that it is in a generally vertical orientation (which may allow the circuit board to be cut without a cutting tool of the robotic arm piercing a conveyor belt). Once microchip 52 is ready to be extracted, robotic arm 20 may pierce circuit board 50 using cutting tool 24, with the piercing being adjacent to microchip 52. Following, robotic arm 20 may move cutting tool 24 in a generally circular motion around microchip 52 until a complete cut is made through circuit board 50. Once the cut is completed, with the seal between suction cup 22 and microchip 52 still intact, robotic arm 20 may then lift extracted portion 57 (microchip 52 and extracted circuit board 53) from residual portion 55 of circuit board 50 and move extracted portion 57 toward second conveyor belt 42. Once extracted portion 57 is positioned over second conveyor belt 42, robotic arm 20 may release extracted portion 57 by disengaging suction cup 22 from microchip 52, allowing extraction portion 57 to fall onto second conveyor belt 42.

Figure 5:
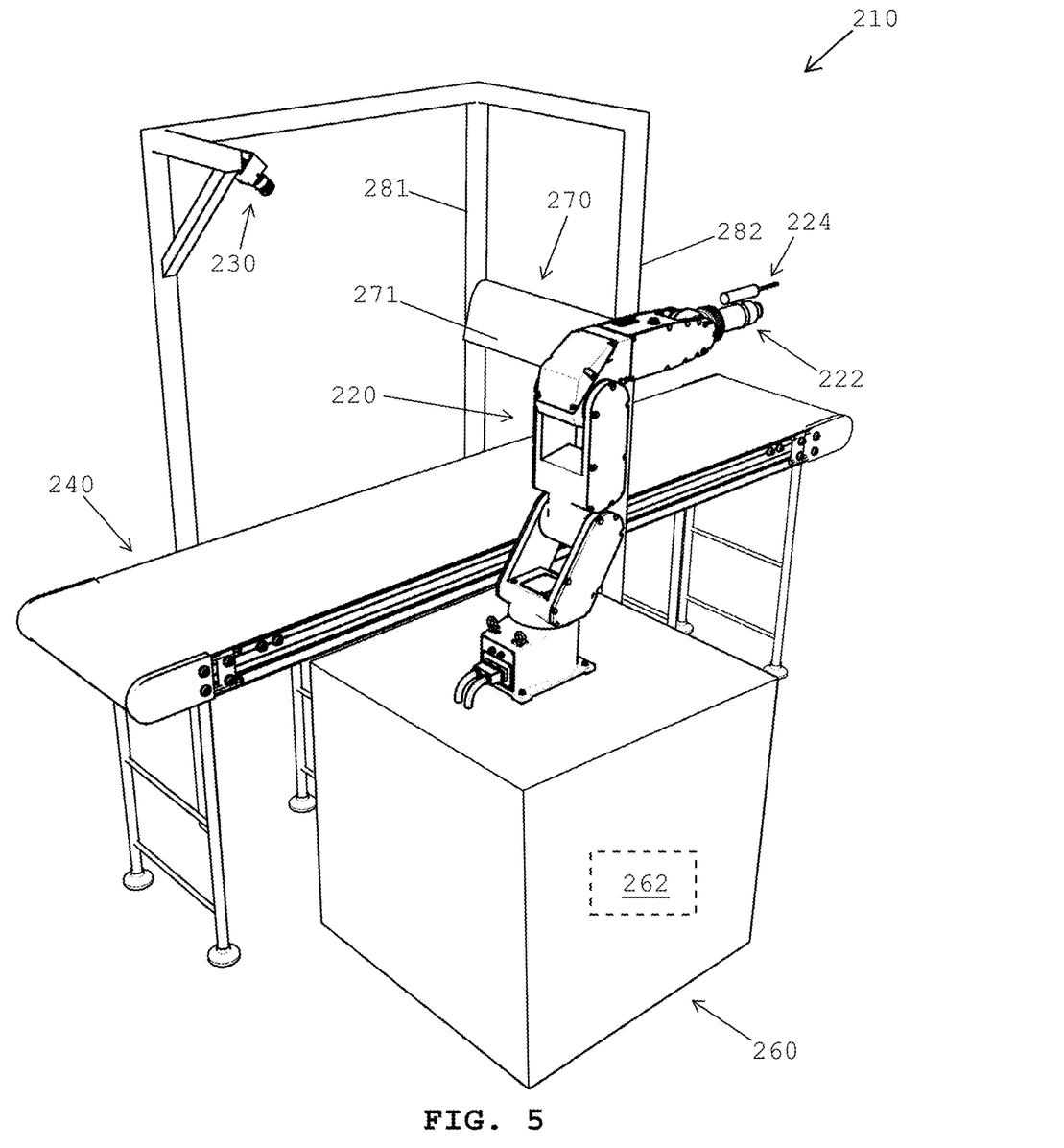
FIG. 5 is a top perspective view diagram illustrating an exemplary system for extracting a microchip from a circuit board, in accordance with some embodiments of the present invention.
Figure 6:
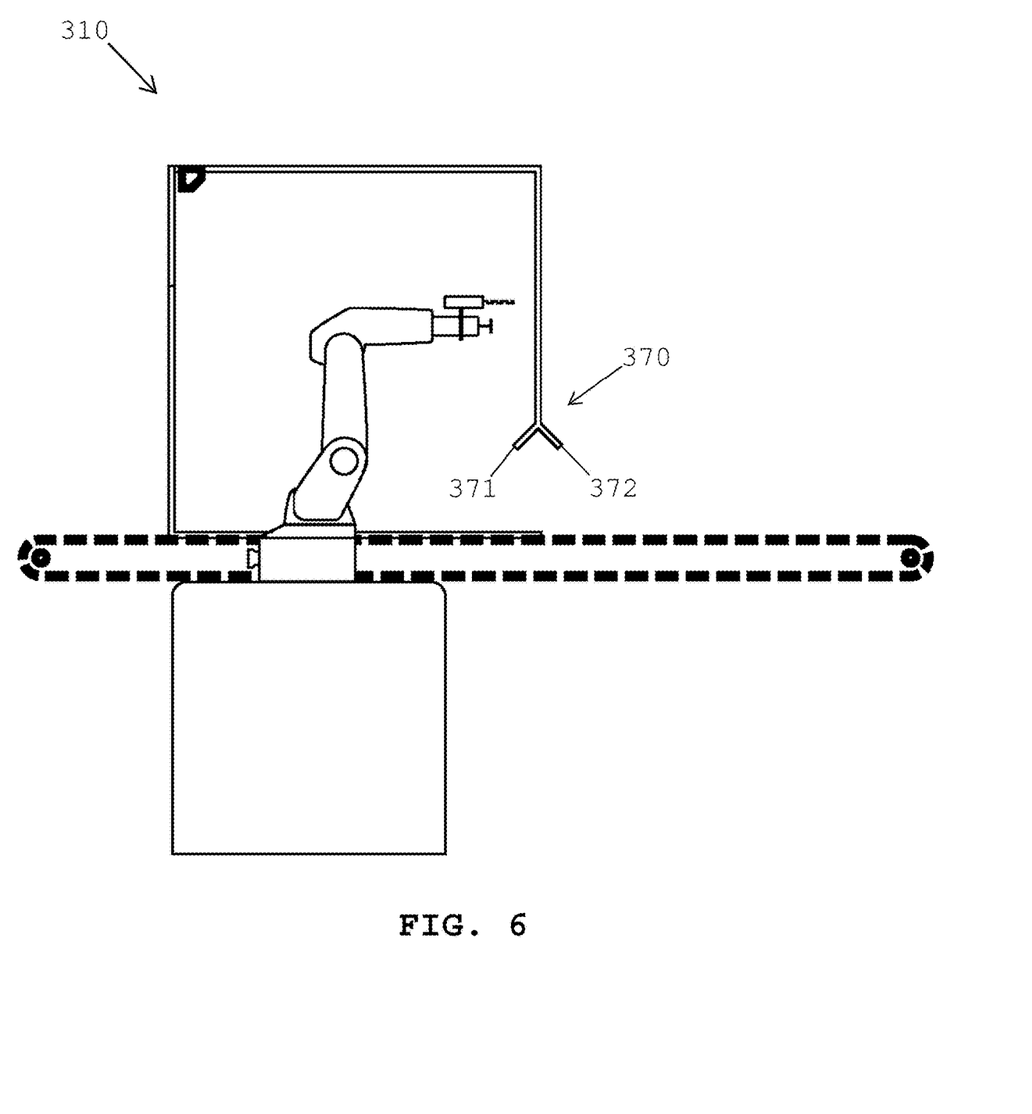
FIG. 6 is a side view diagram illustrating an exemplary system for extracting a microchip from a circuit board, in accordance with some embodiments of the present invention.

In another implementation of the present invention, and with reference to FIG. 5, a method for extracting a microchip from a circuit board may be generalized by the following steps. First, a decommissioned circuit board may be received on conveyor belt 240 in a non-extractable position. Next, camera 230 may capture one or more images. Then, camera 230 may transmit image data corresponding to the one or more captured images to system controller 262. Following, system controller 262 may process the image data (or, optionally, camera 230 may process the image data) and send operational data to one or more motors of conveyor belt 240 (or, more particularly, the motor driver(s) thereof). Next, the motor(s) of conveyor belt 240 may be activated to convey the circuit board toward camera 230 and robotic arm 220 until the circuit board is in an extractable position. Then, camera 230 may capture one or more additional images. Following, camera 230 may send image data corresponding to the one or more additional images to system controller 262. Next, system controller 262 may process the image data and send operational data to the motor(s) of conveyor belt 240. Then, the motor(s) of conveyor belt 240 may be deactivated to stop conveyance of the circuit board. Following, system controller 262 may transmit operational data to one or more motors and/or actuators of retaining system 270. Next, the motor(s) and/or actuator(s) of retaining system 270 may be activated to secure the circuit board in an upright position. Then, system controller 262 may transmit operational data to one or more motors and/or actuators of robotic arm 220. Following, the motor(s) and/or actuator(s) of robotic arm 220 may cause robotic arm 220 to engage the microchip and make a complete cut in the circuit board around the microchip. Next, the motor(s) and/or actuators of retaining system 270 may cause retaining system 270 to release the residual circuit board. Then, the motor(s) and/or actuator(s) of robotic arm 220 may cause robotic arm 220 to disengage the microchip. Following, the motor(s) of conveyor belt 240 may activate conveyor belt 240 to convey the residual circuit board away from camera 230 and robotic arm 220.

It is to be appreciated that a method for extracting a microchip may not be limited to the any of the steps disclosed herein. For example, after the robotic arm completes the cut around the microchip, the control module may cause the robotic arm to move to a different position, prior to the release of the residual circuit board. It is also to be understood that the steps disclosed herein may not be performed the order presented. For example, the robotic arm may disengage the microchip before the residual circuit board is released. Furthermore, it is to be understood that some of the steps disclosed herein may be performed simultaneously. For example, the camera may continuously capture images and transmit image data to the computer (rather than in discrete steps), such that other steps (e.g., activation/deactivation of the conveyor belt) may performed during image capture. It is further to be understood that processing of data may be performed by a central computer (e.g., the system controller) or by processors integrated with the system components (e.g., the camera). For example, image processing may be performed in-whole or in-part by the camera (having a processing portion) and/or the system controller.

It is to be appreciated that an extraction system may comprise various configurations for achieving extraction of hardware from a circuit board. For example, and with reference to FIGS. 3 and 4, an extraction system 110 may comprise a first conveyor belt 141 which may be slotted (i.e., having slots 149) and a second conveyor belt 142 which may comprise a smooth conveying surface, where first conveyor belt 141 and second conveyor belt 142 may be immediately adjacent to each other. As further illustrated in FIGS. 3 and 4, a robotic arm 120 may be positioned adjacent to each of a discard end 145 of first conveyor belt 141 and a receiving end 148 of second conveyor belt 142. In contrast with the exemplary embodiment of FIG. 1, robotic arm 20 may rotate about 90 degrees or less in a horizontal direction when moving an extracted microchip (or other hardware) from first conveyor belt 141 to second conveyor belt 142, whereas robotic arm 20 may rotate about 180 degrees or less when moving extracted microchip 52 from first conveyor belt 41 to second conveyor belt 42. Also in contrast with the exemplary embodiment of FIG. 1, first conveyor belt 141 may have a direction of conveyance (generally toward the left of FIG. 3) which may be opposite that of second conveyor belt 142 (generally toward the right of FIG. 3), whereas first conveyor belt 41 and second conveyor belt 42 have the same direction of conveyance. As further illustrated in FIG. 3, bins, or other types of receptacles, may be disposed at discard end 145 of first conveyor belt 141 and at a recycling end 146 of conveyor belt 142 for receiving residual circuit board portions and extracted microchips (or other hardware), respectively.

According to some embodiments, a computer in operative connection with a robotic arm, a camera, and one or more conveyor belts may be used to automate, or semi-automate a hardware extraction process. For example, and with reference to FIG. 1, a computer (not illustrated) comprising a processor with a memory may cause first conveyor belt 41 to convey circuit board 50 generally towards robotic arm 20 and camera 30. In some implementations, activation of first conveyor belt 41 by the computer may be in response to image data received from camera 30. For example, camera 30 may not detect circuit board 50 within its field of view, or circuit board 50 may not otherwise be in a position for extraction and corresponding image data may be transmitted to, and processed by the computer, which, consequently, may cause first conveyor belt to start conveying circuit board 50.

It is to be appreciated that, and according to some embodiments, a camera may detect a position of a circuit board on a conveyor belt, as well as an orientation of the circuit board relative to the camera. In some embodiments, a camera may detect a position of a microchip on a circuit board. For example, and with further reference to FIG. 1, when circuit board 50 is in a position for extraction (e.g., position B), camera 30 may transmit image data, corresponding to a position and/or orientation of circuit board 50 and microchip 52, to the computer to cause robotic arm 20 to move toward and contact microchip 52 at suction cup 22 in response to the image data. Once suction cup 22 has contacted microchip 52, the computer may cause a suction mechanism of suction cup 22 to activate and thereby engage microchip 52 in response to data received from robotic arm 20. When microchip 52 is engaged by suction cup 22, and in response to data from robotic arm 20, the computer may cause cutting tool 24 to move perpendicular to the surface of circuit board 50 to pierce it and then move cutting tool 24 in a rotary motion. Once cutting tool 24 has made a complete cut around microchip 52, the computer may cause robotic arm 20 to lift microchip 52 and extracted circuit board 53 from residual portion 55 and place microchip 52 onto (or above) second conveyor belt 42, in response to data received from robotic arm 20. Once microchip 52 is on (or above) second conveyor belt 42, the computer may cause suction cup 22 of robotic arm 20 to disengage microchip 52, in response to data received from robotic arm 20. In response to data received from robotic arm 20, the computer may cause second conveyor belt 42 to convey microchip 52 toward recycling end 46.

It is to be understood that variations, modifications, and permutations of embodiments of the present invention may be made without departing from the scope thereof. It is also to be understood that the present invention is not limited by the specific embodiments, descriptions, or illustrations or combinations of either components or steps disclosed herein. Thus, although reference has been made to the accompanying figures, it is to be appreciated that these figures are exemplary and are not meant to limit the scope of the invention.

What is claimed is:

1. A method for extracting one or more hardware pieces from a printed circuit board using (i) a robotic arm having a cutting tool at a free end, (ii) a camera, and (iii) a conveyance system for conveying said printed circuit board and said one or more hardware pieces, said method comprising the steps of:
    a) receiving said printed circuit board;
    b) conveying said printed circuit board toward said robotic arm;
    c) capturing at least one circuit board image using said camera;
    d) from said at least one image, identifying a first hardware piece and said printed circuit board;
    e) moving said free end of said robotic arm toward said printed circuit board;
    f) activating a hardware engagement mechanism of said robotic arm to engage said first hardware piece;
    g) piercing said printed circuit board with said cutting tool adjacent to said first hardware piece;
    h) moving said cutting tool around said first hardware piece until a first extracted portion of said printed circuit board with said first hardware piece is removed from a first residual portion of said printed circuit board; and
    i) disactivating said hardware engagement mechanism to release said first extracted portion.

2. The method of claim 1, wherein said first residual portion comprises a second hardware piece and wherein said method further comprises the steps of:
    j) activating said hardware engagement mechanism of said robotic arm to engage said second hardware piece;
    k) piercing said printed circuit board with said cutting tool adjacent to said second hardware piece;
    l) moving said cutting tool around said second hardware piece until a second extracted portion of said printed circuit board with said second hardware piece is removed from a second residual portion of said printed circuit board; and
    m) disactivating said hardware engagement mechanism to release said second extracted portion.

3. The method of claim 2, further comprising the step of:
    n) conveying each of said first extracted portion and said second extracted portion toward a recycling end of said conveyance system.

4. The method of claim 3, wherein said first hardware piece is a first microchip and wherein said second hardware piece is a second microchip.

5. The method of claim 3, further comprising the step of:
    o) shipping said first extracted portion to a first processing facility and shipping said second extracted portion to a second processing facility.

6. The method of claim 5, further comprising the step of:
    p) conveying said second residual portion toward a disposal end of said conveyance system.

7. The method of claim 6, further comprising the step of:
    q) shipping said second residual portion to a third processing facility.

8. The method of claim 1, wherein, before said step of conveying said printed circuit board toward said robotic arm, said camera captures a first image and transmits a first image data set to a system controller operatively connected to said camera, said first image data set comprising said first image.

9. The method of claim 8, wherein said step of conveying said printed circuit board toward said robotic arm comprises actuating said conveyance system using a conveyance control module operatively connected to each of said conveyance system and said system in response to said first image data.

10. The method of claim 9, wherein, after said step of capturing said circuit board image using said camera, a second image data set is transmitted to said system controller, said second image data set comprising said circuit board image.

11. The method of claim 10, wherein said system controller is operatively connected to said robotic arm and wherein each of said steps of:
  e) moving said free end of said robotic arm toward said printed circuit board;
  f) activating said hardware engagement mechanism of said robotic arm to engage said first hardware piece;
  g) piercing said printed circuit board with said cutting tool adjacent to said first hardware piece; and
  h) moving said cutting tool around said first hardware piece until said first extracted portion of said printed circuit board with said first hardware piece is removed from said first residual portion of said printed circuit board;
  are caused by said system controller in response to said second image data.

12. The method of claim 10, wherein, before said step of moving said robotic arm toward said printed circuit board, a location of said first hardware piece on said printed circuit board is identified using said second image data.

13. The method of claim 1, further comprising a retaining step, said retaining step comprising retaining a top side of said printed circuit board by an arm of a retaining system, wherein said retaining step is performed after said step of conveying said printed circuit board toward said robotic arm.

14. The method of claim 13, wherein said retaining system comprises a first arm and a second arm and wherein said top side of said printed circuit board is retained by each of said first arm and said second arm.

15. The method of claim 14, wherein said first arm and said second arm are each pivotally engaged with a crossbar.

16. The method of claim 15, wherein during said retaining step, each of said first arm and said second arm are rotated about 90 degrees.

17. The method of claim 14, wherein a first end of each of said first arm and said second arm are engaged with a first post and wherein a second end of each of said first arm and said second arm are engaged with a second post.

18. The method of claim 17, wherein during said retaining step, each of said first arm and said second arm are moved vertically along, and between, said first post and said second post.

19. The method of claim 1, further comprising the step of:
  j) conveying said first extracted portion toward a recycling end of said conveyance system.

20. The method of claim 1, wherein said step of receiving said printed circuit board comprises placing said printed circuit board in a slot of said conveyor belt, said slot supporting a bottom of said printed circuit board.

21. The method of claim 1, wherein said cutting tool of said robotic arm comprises a computer numerical control bit and wherein said method further comprises rotating said bit during said steps of: g) piercing said printed circuit board with said cutting tool adjacent to said first hardware piece; and h) moving said cutting tool around said first hardware piece until said first extracted portion of said printed circuit board with said first hardware piece is removed from said first residual portion of said printed circuit board.

* * * * *